TRANSISTOR PUSH-PULL AMPLIFIER

Filed April 6, 1954

INVENTORS
RALPH GITTLEMAN
JACOB TELLERMAN
BY
Raymond A. Paquin
ATTORNEY.

United States Patent Office 2,816,179

Patented Dec. 10, 1957

2,816,179

TRANSISTOR PUSH-PULL AMPLIFIER

Ralph Gittleman, Greatneck, and Jacob Tellerman, Brooklyn, N. Y., assignors to American Bosch Arma Corporation Application April 6, 1954, Serial No. 421,417

7 Claims. (Cl. 179—171)

The present invention relates to signal amplifiers and has particular reference to amplifiers employing junction transistors.

In the present invention, two similar type junction transistors are connected in a push-pull combination which provides a class A circuit operating from a single ended source. The emitters of the transistors are connected to each other, the signal is applied across the transistor bases, and the collectors are connected to the primary winding of the output transformer. The bias supply for the collectors is connected between the grounded base and the effective center point of the transformer primary. The A. C. flowing through the collector of the transistor whose base is not grounded and one half of the transformer primary flows through the emitter of the transistor with the grounded-base. Since the current through the collector of a ground base junction transistor is substantially equal to the emitter current, the current flowing through the collector of the grounded base transistor and the other half of the primary winding of the output transformer is substantially equal to the current in the first half of the primary. In this manner automatic balancing of the push-pull stage is accomplished without requiring matched transistors.

One advantage of the present circuit is that it does not require the selection of matched transistors. Another advantage is found in the use of two similar type transistors, rather than a pair of oppositely poled transistors. Yet another advantage is that the current gain of NPN junction transistor is stabilized over a greater range of temperatures than heretofore.

For a better understanding of the invention, reference may be had to the accompanying diagrams, in which Figure 1 shows one embodiment of the invention;

Figure 1:
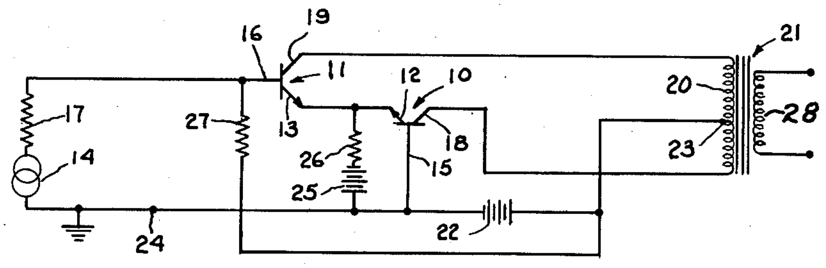

Referring now to Figure 1 a pair of similar type junction transistors 10 and 11 are shown in a circuit embodying the present inventon. Transistors 10 and 11 are shown as n-p-n type transistors although p-n-p type can be used equally as well by using properly polarized power supplies.

The emitters 12 and 13 of transistors 10 and 11 respectively are connected to each other while the signal generator 14 is connected to the bases 15 and 16 of transistors 10 and 11. The resistor 17, interposed between generator 14 and base 16, may be the internal resistance of generator 14. The respective collectors 18 and 19 of transistors 10 and 11 are conected to the extremities of primary winding 20 of output transformer 21. Power supply 22, which supplies the collector bias current, is connected between the center tap 23 on winding 20 and the ground lead 24 to which the base 15 and the grounded side of generator 14 are also connected. Obviously, the polarity of power supply 22 must correspond with the type of transistors employed, so that in Figure 1 the positive terminal of supply 22 is connected to the collectors 18 and 19 through winding 20, and the negative terminal of power supply 22 is connected to ground 24. Power supply 25 having its positive terminal connected to ground 24 and its negative terminal connected to emitter 12 through resistor 26 provides the bias current for emitter 12. Bias current for emitter 13 may be provided in numerous ways, as from power supply 25, from a separate power supply (not shown), or from power supply 22 as shown in Figure 1 by connecting the base 16 to the positive side of power supply 22 through resistor 27.

It will be seen that transistor 10 is a grounded base transistor while transistor 11 operates as a grounded emitter transistor since emitter 13 can be considered as being grounded through the low resistance of emitter 12 and base 15 of transistor 10.

The alternating current which flows in the circuit of collector 19 as a result of the signal at generator 14 flows through collector 19, emitters 13 and 12, base 15, battery 22 and the upper half of winding 20.

It is known that the current in the collector of a grounded base junction transistor is substantially equal in magnitude to the emitter current since the ratio of currents is equal to $\alpha$, the current amplification factor, which approaches unity in value. Therefore, the current flowing in the circuit of collector 18, which includes the other half of winding 20 (lower half in Figure 1) will be substantially equal in magnitude to the current in emitter 12 without any pre-selection of special or matched transistors.

It is also known that there is no phase reversal of output in a grounded base transistor such as that exhibited by a grounded emitter transistor. It will be seen then that a clockwise flow of current from collector 19 will produce current flow toward collector 18 in transistor 10, and a counter-clockwise flow of current from collector 19 will produce current flow away from collector 18. Thus, the currents in both halves of transformer primary winding 20 are in the same direction and aid in producing an output signal in secondary winding 28.

Figure 2:
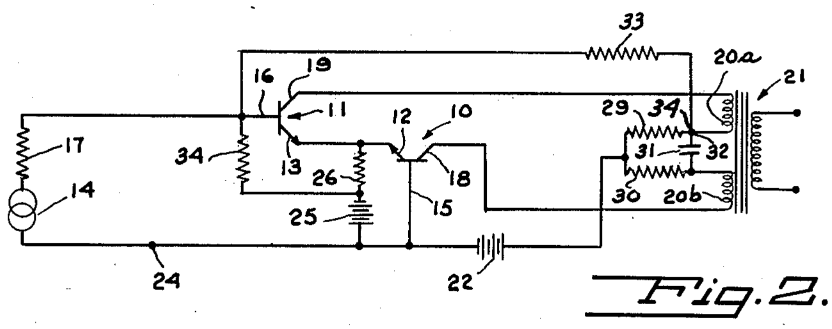
Figure 2 shows the addition of D. C. stabilization to the circuit of Fig. 1.

Figure 2 shows a push-pull stage similar to that in Figure 1 with the added advantage of high temperature stabilization for direct current for the grounded-emitter transistor 11. The action of the stabilization system is fully described in the copending application for "Transistor Amplifier with D. C. Stabilization for High Temperature Operation" filed in the name of Jacob Tellerman Serial Number 434,904, filed June 7, 1954.

To the end that stabilization can be satisfactorily accomplished, the primary winding 20 of transformer 21 is a split primary composed of the separate windings 20*a* and 20*b*. The positive terminal of D. C. power supply 22 is connected to the windings 20*a* and 20*b* through the respective equal resistors 29 and 30 and a capacitor 31 is connected between the windings 20*a* and 20*b*. The junction point 32 between resistor 29 and winding 20*a* is connected to the base 16 through a feedback resistor 33.

The feedback resistor 33 and resistor 29 will serve to provide bias for emitter 13 of transistor 11, as resistor 27 did in Figure 1. In the event that the bias thus provided is too great, a negative bias may be provided for emitter 13 through resistor 34 which is connected from base 16 to the negative terminal of power supply 25.

Briefly, the D. C. stabilization operates by feedback of direct current from the load to the base 16 of transistor 11 through the feedback resistor 33 which has a resistance value comparable to the D. C. load resistance 29. Provision is made to keep the A. C. feedback small in order not to impair the A. C. gain.

Figure 3:
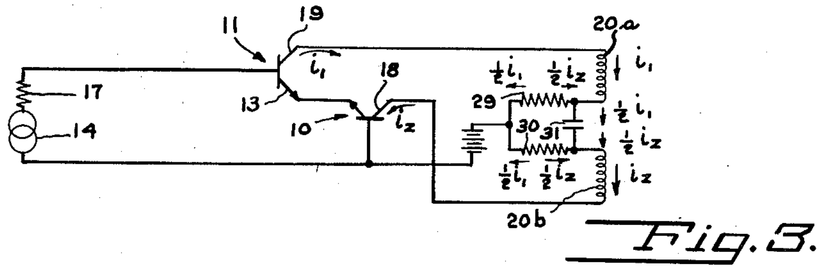
Figure 3 shows the division of alternating currents in the circuit of Fig. 2.

Referring now to Figure 3, it will be seen that if the impedance of capacitor 31 is small the alternating current $i_1$ of collector 19 is divided very nearly equally in resistors 29 and 30. Also, the current $i_2$ of collector 18 is divided very nearly equally in resistor 29 and 30. The components of the $i_1$ and $i_2$ currents in each of the resistors 29 and 30 are in opposite directions so that the A. C. voltage drops across resistors 29 and 30 are small and only a small amount of power is lost in these resistors. The current through capacitor 31 is approximately equal to $\frac{1}{2}i_1+\frac{1}{2}i_2$, but the impedance is small and the A. C. voltage drop across the capacitor 31 is small. Therefore, it will be seen that the A. C. feedback is small and the A. C. gain is not seriously affected.

Figure 4:
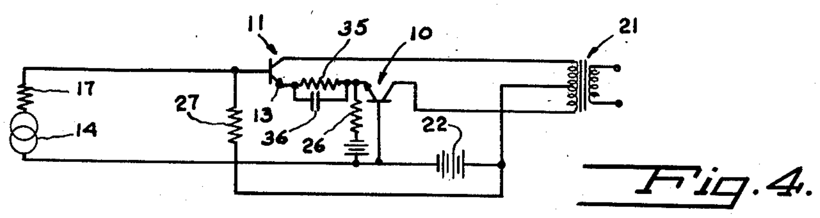
Figure 4 shows a different method of D. C. stabilization.

An alternative method for D. C. stabilization for the circuit of Figure 1 is shown in Figure 4 where a resistor 35 is connected between emitter 13 and resistor 26 to provide stabilization in the manner now well known. A capacitor 36 is connected across resistor 35 to decrease the input impedance of the circuit to the alternating input signal.

We claim:

1. In a device of the character described, a single ended input signal source, a pair of similar type transistors each having base, collector and emitter electrodes, one of said transistors being connected as a grounded base transistor, the emitters of said transistors being electrically connected together through a short circuit for signal frequencies, said input signal source being connected across the bases of said transistors and the collectors of said transistors being connected to the output circuit, bias means for said emitters, and bias means for said collectors connected between said output circuit and the base of the said one of said transistors, and a relatively high impedance between the emitters and ground externally of said transistors, the collector current of one transistor being caused to flow through both emitters whereby the collector current of the other transistor is made equal to the collector current of the first transistor without the necessity of matching the transistors.

2. In a device of the character described, a single ended input signal source, a pair of similar type transistors each having base, collector and emitter electrodes, one of said transistors being connected as a grounded base transistor, the emitters of said transistors being electrically connected together through a short circuit for signal frequencies, said input signal source being connected across the bases of said transistors and the collectors of said transistors being connected to the output circuit, bias means for said emitters, the input signal source being connected between ground and the base of the said one transistor, the base of the other transistor being connected to ground and bias means for said collectors connected between said output circuit and ground, and a relatively high impedance between the emitters and ground externally of said transistors, the collector current of one transistor being caused to flow through both emitters whereby the collector current of the other transistor is made equal to the collector current of the first transistor without the necessity of matching the transistors.

3. In a device of the character described, a single ended input signal source, a pair of similar type transistors each having base, collector and emitter electrodes, one of said transistors being connected as a grounded base transistor, the emitters of said transistors being electrically connected together through a short circuit for signal frequencies, said input signal source being connected across the bases of said transistors, the collectors of said transistors being connected to the output circuit, and bias means for said emitters, said connection of collectors of said transistors to said input circuit being across the primary of a transformer and bias means for said collectors connected between a center tap of said primary and the base of the said one of said transistors, and a relatively high impedance between the emitters and ground externally of said transistors, the collector current of one transistor being caused to flow through both emitters whereby the collector current of the other transistor is made equal to the collector current of the first transistor without the necessary of matching the transistors.

4. In a device of the character described, a single ended input signal source, a pair of similar type transistors, each having base, collector and emitter electrodes, one of said transistors being connected as a grounded base transistor, the emitters of said transistors being electrically connected together through a short circuit for signal frequencies, said input signal source being connected across the bases of said transistors and the collectors of said transistors being connected to the output circuit, and bias means for said emitters and collectors, the input signal source being connected between ground and the base of the other transistor, the base of the said one transistor being connected to ground and said connection of collectors of said transistors to said output circuit being across the primary of a transformer, a center tap of said primary being connected to ground through at least a part of said bias means, and a relatively high impedance between the emitters and ground externally of said transistors, the collector current of one transistor being caused to flow through both emitters whereby the collector current of the other transistor is made equal to the collector current of the first transistor without the necessity of matching the transistors.

5. In a device of the character described, a single ended input signal source, a pair of similar type transistors each having base, collector and emitter electrodes, one of said transistors being connected as a grounded base transistor, the emitters of said transistors being electrically connected together through a short circuit for signal frequencies, said input signal source being connected across the bases of said transistors and the collectors of said transistors being connected to the output circuit, and bias means for said emitters and collectors, the input signal source being connected between ground and the base of the other transistor, the base of the said one transistor being connected to ground, said connection of the collectors to said output circuit being connected to the primary windings of an output transformer, the primary windings being connected together through a pair of resistors and a capacitor in parallel with said resistors, bias voltage connected between the ground and the junction of said resistors and a feedback resistor connected between the ungrounded base and that end of the capacitor which is connected to the collector of the transistor with the ungrounded base, and a relatively high impedance between the emitters and ground externally of said transistors, the collector current of one transistor being caused to flow through both emitters whereby the collector current of the other transistor is made equal to the collector current of the first transistor without the necessity of matching the transistors.

6. In a device of the character described, a single ended input signal source, a pair of similar type transistors each having base, collector and emitter electrodes, one of said transistors being connected as a grounded base transistor, the emitters of said transistors being electrically connected, said input signal source being connected across the bases of said transistors, the collectors of said transistors being connected to the output circuit, and bias means for said emitters and a parallel resistor and capacitor interposed in the connections between the emitters of said transistors, and bias means for said collectors connected between the output circuit and the base of one of said transistors, and a relatively high impedance between the emitters and ground external of the transistors, the collector current of one transistor being caused to flow through both emitters whereby the collector current of the other transistor is made equal to the collector current of the first transistor without the necessity of matching the transistors.

7. In a device of the character described, a single ended input signal source, a pair of similar type transistors each having base, collector and emitter electrodes, one of said transistors being connected as a grounded base transistor, the emitters of said transistors being electrically connected, said input signal source being connected across the bases of said transistors and the collectors of said transistors being connected to the output circuit, bias means for said emitters, the input signal voltage being connected between ground and the base of the other transistor, the base of the said one transistor being connected to ground, a parallel resistor and capacitor interposed in the connections between the emitters of said transistors, and bias means for said collectors being connected between the output circuit and ground, and a relatively high impedance between the emitters and ground external of the transistors, the collector current of one transistor being caused to flow through both emitters whereby the collector current of the other transistor is made equal to the collector current of the first transistor without the necessity of matching the transistors.

References Cited in the file of this patent

Caruthers article in text, "The Transistor," pages 354, 355 and 373, pub. by Bell Tel. Labs.. 1951.